(12) United States Patent
Schremmer

(10) Patent No.: US 6,494,745 B1
(45) Date of Patent: Dec. 17, 2002

(54) PC CARD THAT RECEIVES AND GUIDES CHIP CARD

(75) Inventor: Andreas Michael Schremmer, Gerglen (DE)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/996,041

(22) Filed: Nov. 28, 2001

Related U.S. Application Data

(63) Continuation-in-part of application No. PCT/EP00/03006, filed on Apr. 5, 2000.

(30) Foreign Application Priority Data

Jun. 2, 1999 (DE) .......................................... 199 25 146

(51) Int. Cl.[7] .............................................. H01R 24/00
(52) U.S. Cl. ...................... 439/630; 439/377; 439/945; 361/737
(58) Field of Search ................................ 439/630, 377, 439/945; 361/737, 741

(56) References Cited

U.S. PATENT DOCUMENTS

| | | | | |
|---|---|---|---|---|
| 5,680,296 A | * | 10/1997 | Hileman et al. ............ 361/802 |
| 5,752,857 A | * | 5/1998 | Knights ...................... 438/638 |
| 5,877,488 A | * | 3/1999 | Klatt et al. .................. 235/486 |
| 6,075,706 A | * | 6/2000 | Learmonth et al. ......... 361/737 |
| 6,132,223 A | * | 10/2000 | Seeley et al. .............. 439/76.1 |
| 6,149,450 A | * | 11/2000 | Gastineau ................... 439/325 |

* cited by examiner

*Primary Examiner*—P. Austin Bradley
*Assistant Examiner*—Truc Nguyen
(74) *Attorney, Agent, or Firm*—Roger C. Turner

(57) ABSTRACT

A PC card of standard width and thickness (e.g. 54 mm and 5 mm) is constructed to receive a chip card of smaller width and thickness (e.g. 18 mm and 0.8 mm) so the PC card can used to connect contact pads of the chip card to an electronic device such as laptop computer into which the PC card is inserted. The PC card includes a sheet metal cover with a top cover portion (13) having a flat region that is deep drawn to form a ramp (30) that extends downwardly to an aperture (31). A chip card can be slid down along the ramp and through the aperture, and along an internal path portion in the card to engage contacts on a circuit board. Guides on opposite sides of the internal path portion can be formed by tabs (36, 37) partially punched out of the cover portion, parts fastened to the underside of the top sheet metal cover portion, and/or parts or components mounted on the circuit board.

10 Claims, 7 Drawing Sheets

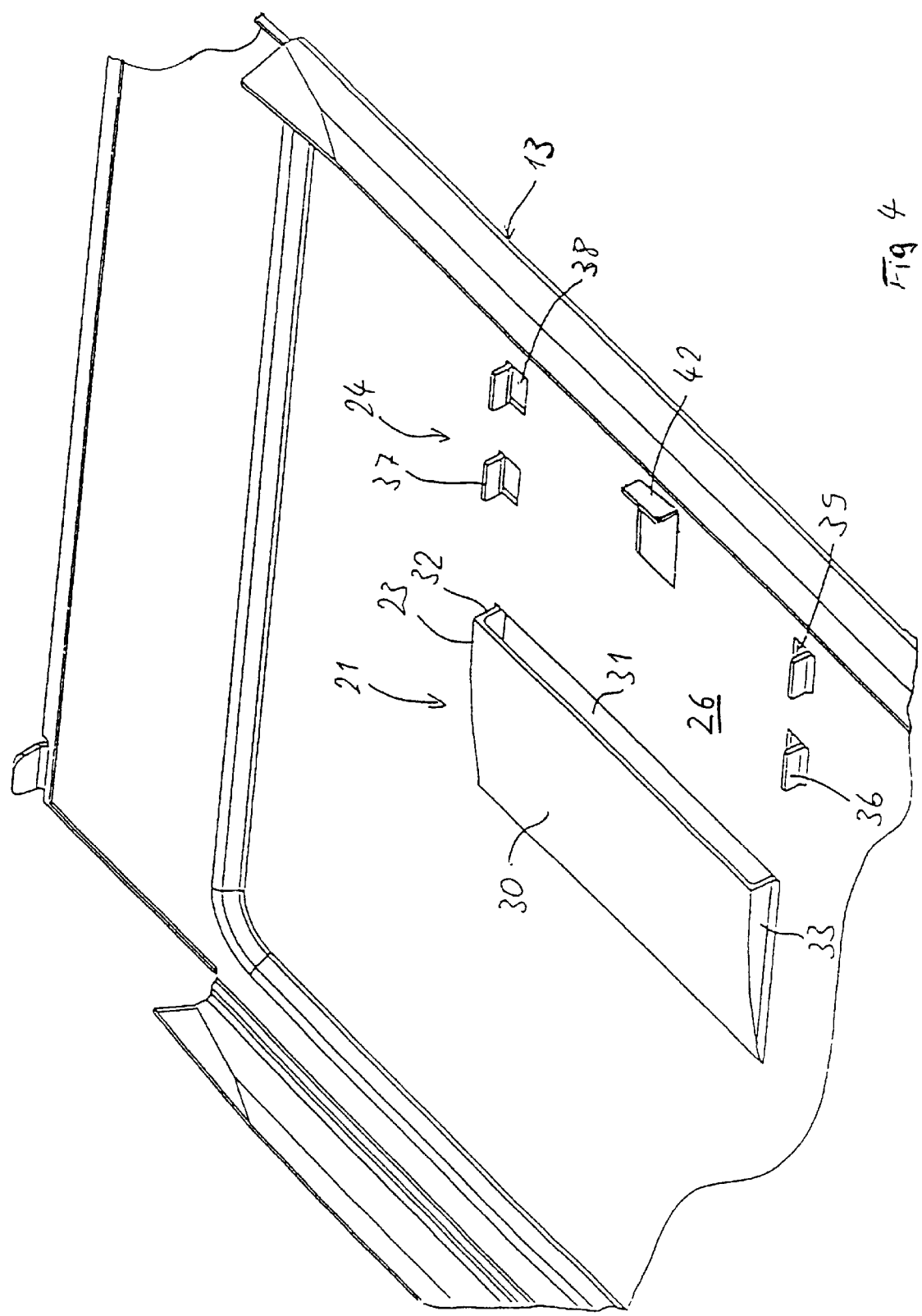

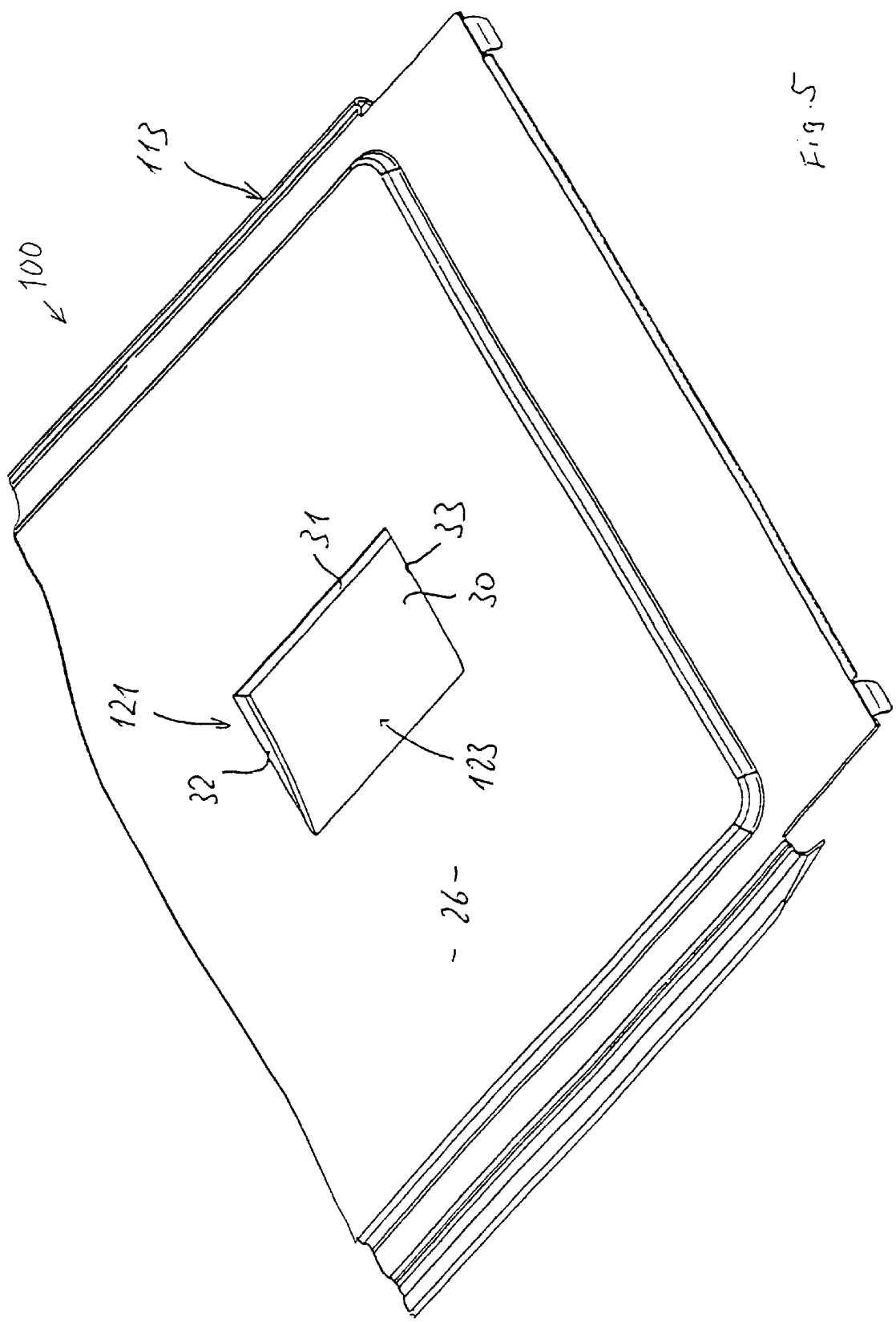

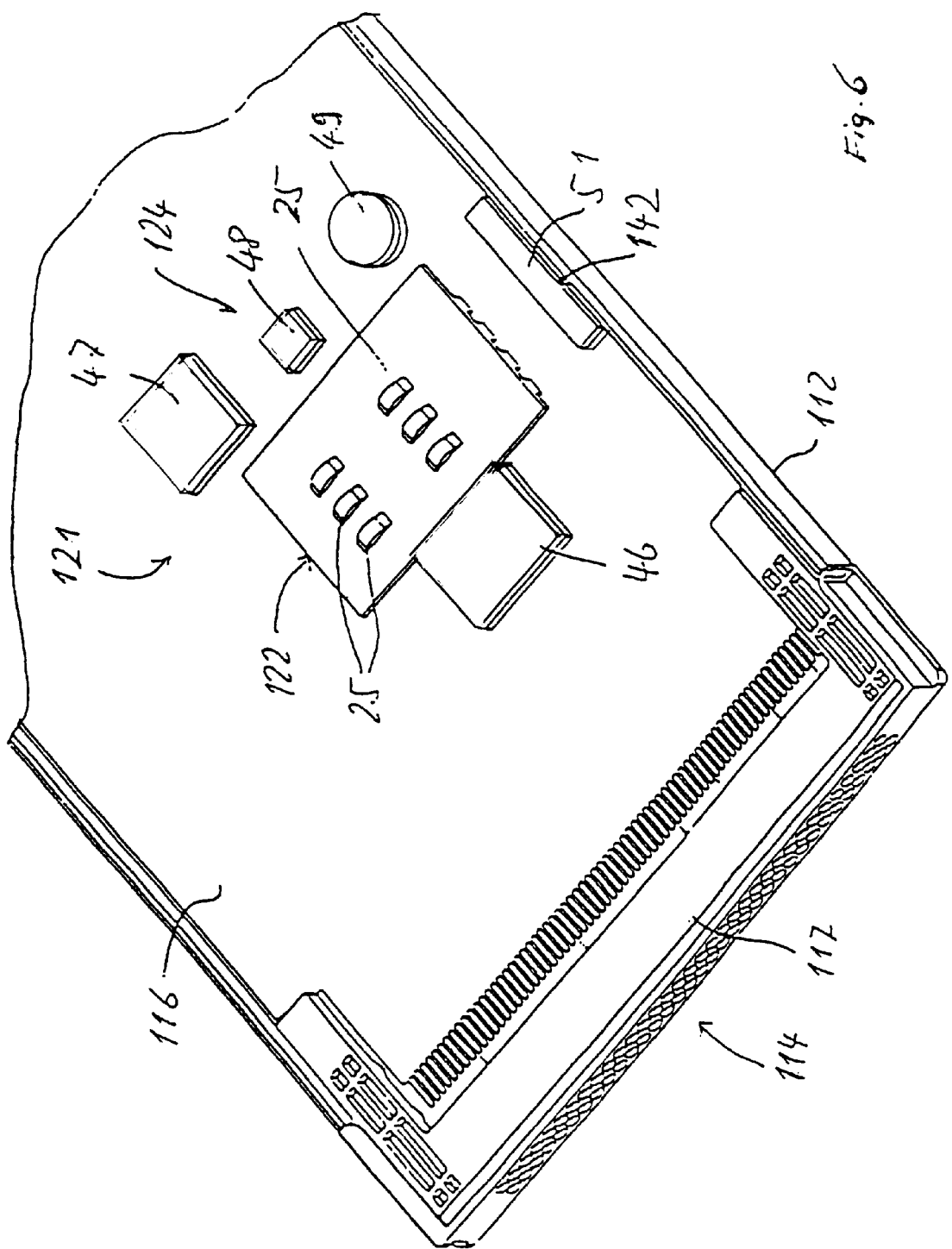

US 6,494,745 B1

PC CARD THAT RECEIVES AND GUIDES CHIP CARD

CROSS-REFERENCE TO RELATED APPLICATION

This is a continuation-in-part of PCT application PCT/EP00/03006 filed Apr. 5, 2000, which claims priority from German application SN 199 25 146.0 filed Jun. 2, 1999.

BACKGROUND OF THE INVENTION

PC cards are usually constructed in accordance with standards of PCMCIA (Personal Computer Memory Card Industry Association) which specifies a card width of 54 mm and a card maximum thickness of 5 mm for the most popular type which is a Type II (Type I has a maximum thickness of 3.3 mm while Type III has a maximum thickness of 10.5 mm). It is noted that the standards can change somewhat. Such a card is designed to be inserted into a slot of an electronic device where a card front connector mates with a connector of the electronic device. It is sometimes useful to provide a PC card that serves as an adapter for a much smaller card such as a SIM card which has a width about one-third that of the PC card (a width of about 18 mm, length of about 28 mm, and thickness of 0.8 mm). Such small cards, which can be referred to as chip cards, are commonly used as credit or authorization cards, as to authorize mobile telephone use. The much smaller and rugged chip cards are of widespread use, and an adapter that enables them to be read and written into by an electronic device such as a laptop computer that can only receive a PC card. A PC card which could receive a much smaller chip card, where the PC card was of simple and rugged design, would be of value.

SUMMARY OF THE INVENTION

In accordance with one embodiment of the present invention, a PC card is provided which is adapted to receive a chip card of much smaller width, thickness, and length than the PC card, and which is of simple construction. Contacts that are terminated to traces on a circuit board that lies within a sheet cover of the PC card, have pad-engaging ends. A planar top portion of the sheet metal cover, is formed with a ramp, and with an aperture at the bottom of the ramp, to guide a card that is inserted along the ramp and through the aperture into a space adjacent to the contacts to engage the contacts.

The ramp is preferably formed by deep drawing of the planar sheet metal to form largely vertical sides at opposite sides of the ramp. Guides at opposite sides of the internal path portion that the card moves along after passing through the aperture, can be formed by tabs punched into the cover sheet metal, separate parts or electronic components mounted on the circuit board, or separate parts mounted to the underside of the sheet metal. A stop limits the length of insertion of the chip card beyond the aperture, so that a portion of the chip card lies on the ramp. The chip card portion on the ramp can be removed by friction applied to it by a finger to slide it up the ramp.

The novel features of the invention are set forth with particularity in the appended claims. The invention will be best understood from the following description when read in conjunction with the accompanying drawings.

BRIEF DESCRIPTION OF THE DRAWINGS

FIG. 4 is a bottom isometric view of the housing top part of FIG. 3.

FIG. 5 is a partial front and top isometric view of a top housing part of a PC card constructed in accordance with a second embodiment of the invention.

FIG. 6 is a front and top isometric view of the PC card of FIG. 5, with the top cover part removed.

DESCRIPTION OF THE PREFERRED EMBODIMENTS

Figure 1:
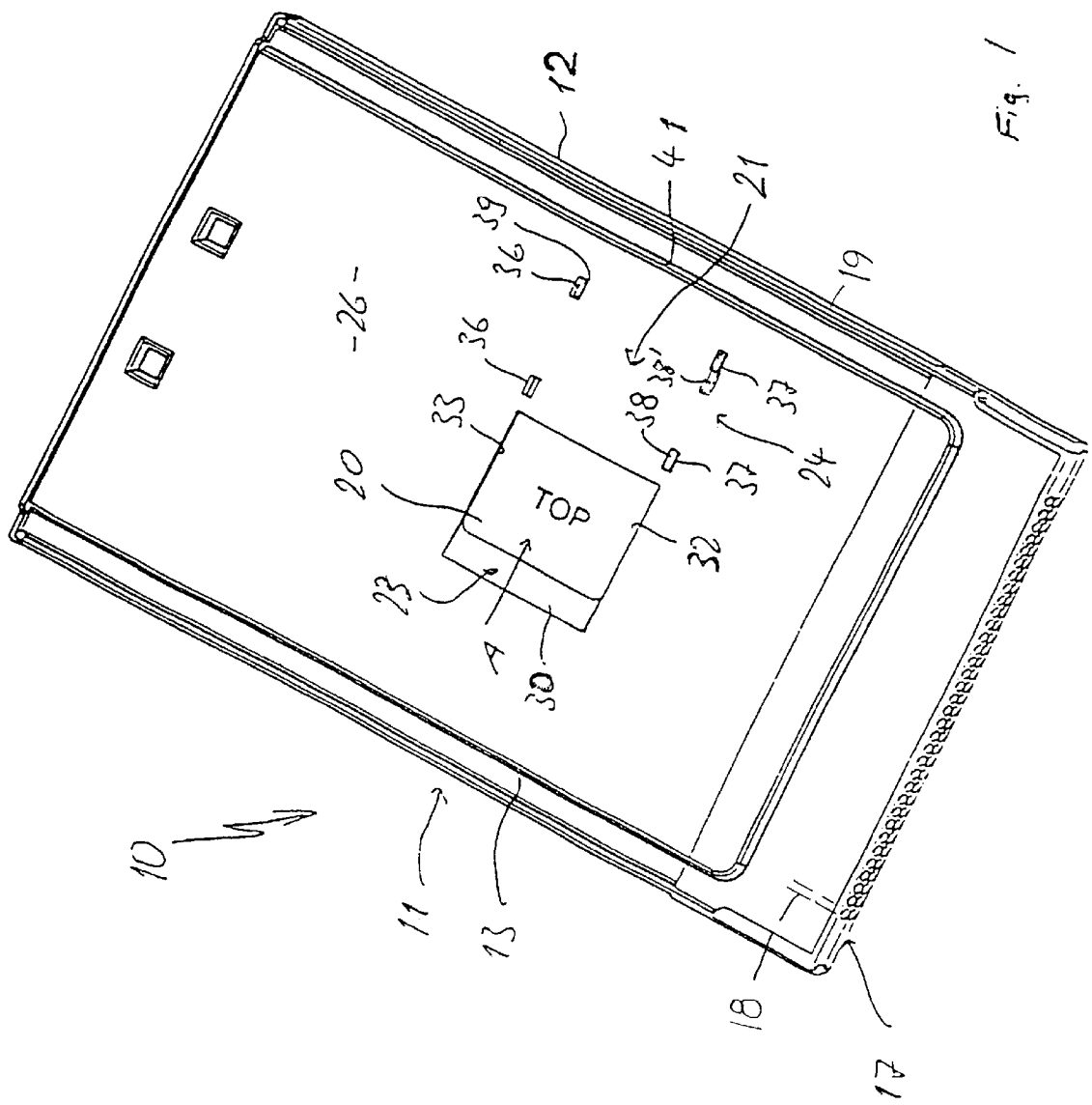
FIG. 1 is a top isometric view of a PC card in accordance with a first embodiment of the invention.
Figure 2:
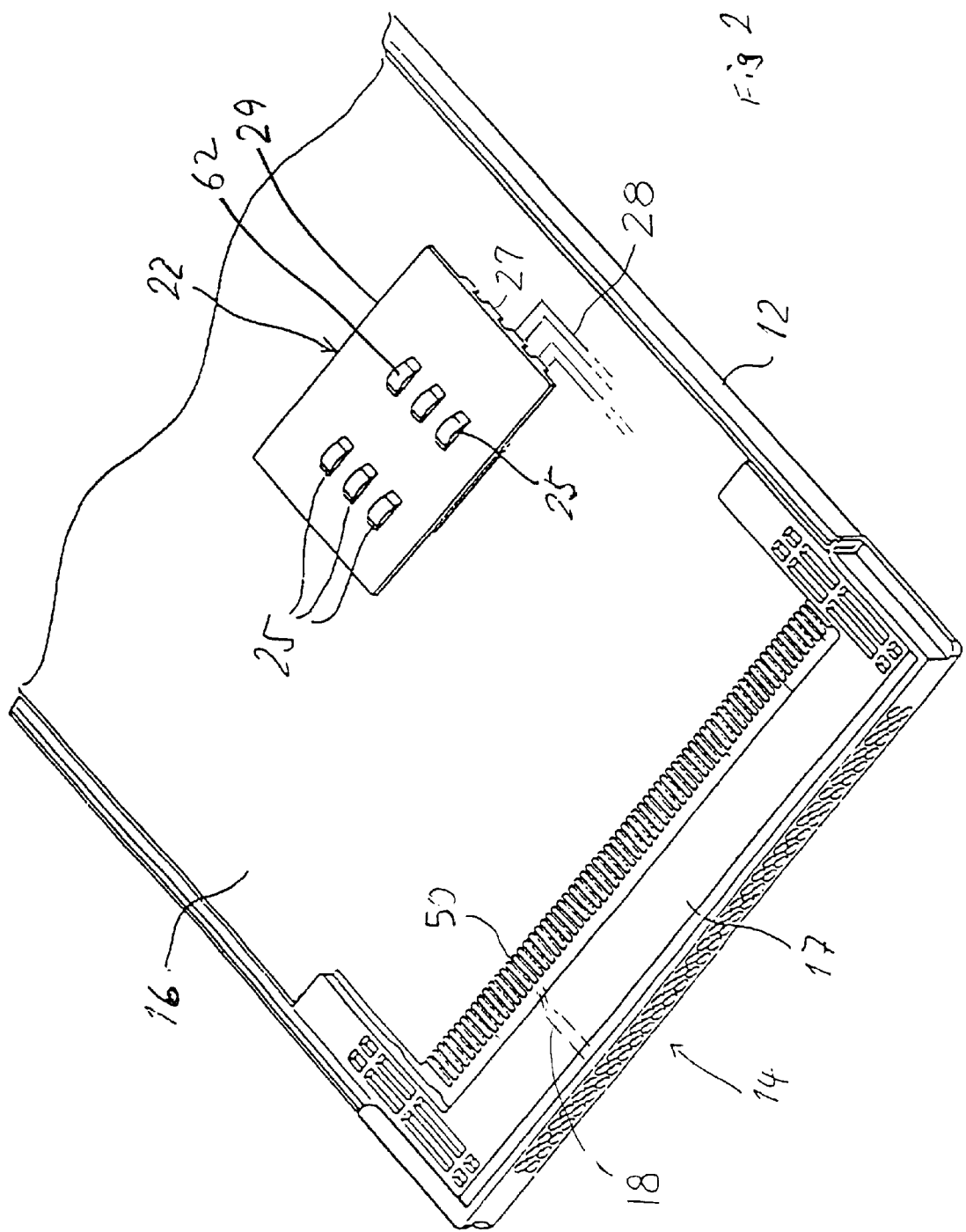
FIG. 2 is a partial top isometric view of the PC card of FIG. 1 with the top housing part removed.

FIG. 1 illustrates a PC card 10 which is of Type II under PCMCIA standards. The PC card is designed to be inserted into a card slot of an electronic device until a front connector 17 of the PC card mates with a device connector at the front end of the card slot. Such mating results in contact elements 18 of the front connector receiving pin contacts of the mating device. The PC card has a rectangular sheet metal cover 11 formed of a lower or bottom sheet metal cover portion 12 and an upper or top sheet metal cover portion 13, the top and bottom portions joined at an edge 19 of the cover. As shown in FIG. 2, a combination 14 of the front connector 17 and a circuit board 16 is provided, with tails 50 of the contact elements 18 soldered to conductive traces on the circuit board.

Figure 3:
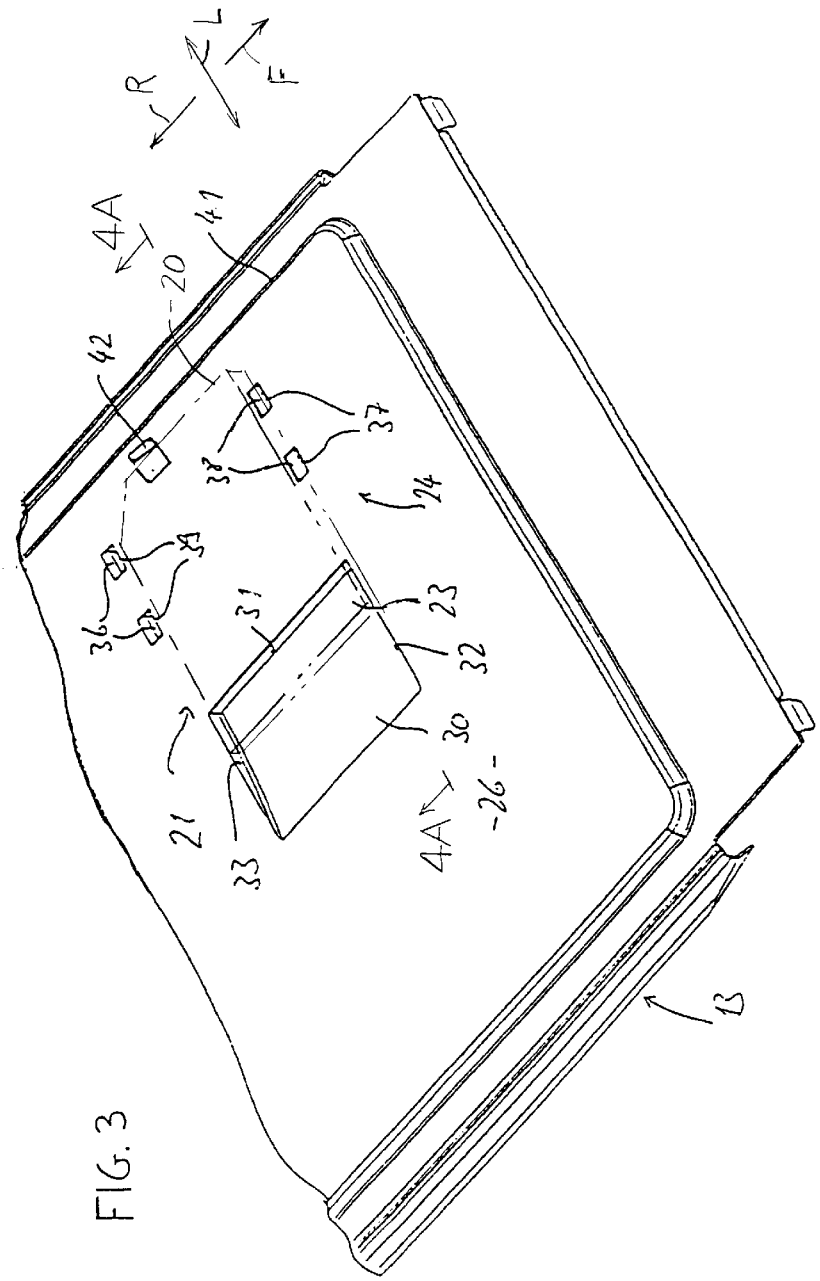
FIG. 3 is a partial front isometric view of the PC card of FIG. 1, and showing, in phantom lines, a fully inserted ship card.

As shown in FIG. 3, the PC card has a receiver 21 for receiving a chip card 20, such as a SIM card. The receiver includes a flat horizontal sheet metal cover portion 26 in which a ramp 30 is formed, and a final guide portion 24 that guides the card as it approaches full installation. FIG. 2 shows that a connector 22 is mounted on the circuit board 16, and includes an insulative connector body 29 and a plurality of contacts 25. The contacts have pad-engaging ends 62 projecting above the body upper face. When the chip card is fully inserted, the contacts 25 engage contact pads on a surface of the chip card. The contacts themselves have tails 27 that are connected to the circuit board traces 28 as by soldering. The traces 28 can be connected directly to contact elements 18 of the front connector, or can be connected through components on the circuit board, such as an amplifier and/or signal processing circuitry to the contact elements 18.

FIG. 3 shows a ramp 30 that extends from the flat area 26 of the top cover portion, in a lateral L direction and at a downward incline of about 8° (4° to 16°) toward the circuit board. The end of the ramp forms a thin slot or aperture 31 through which the chip card can pass. The ramp 30 is preferably formed by deep drawing of the sheet metal to leave largely vertically-extending side edges or sides 32, 34 along the ramp. A chip card can be laid with its leading edge on the ramp 30, and the card then can be slid down along the ramp and through the aperture 31 to its final installed position.

Figure 4A:
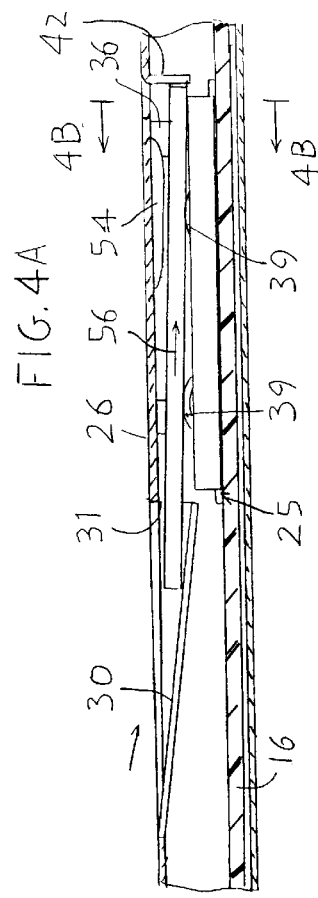
FIG. 4A is a sectional view taken on line 4A—4A of FIG. 3, and showing a fully installed chip card.

FIG. 4A shows a chip card 20 that has been slid along the ramp 30 and laterally L along an internal card path portion 52 until it abuts a lug-shaped stop 42. When the card is fully inserted, it is pressed down by the flat area 26 of the top cover portion, and possibly by an element 54 attached to the cover. The card presses down the card-engaging ends 39 of the contacts so that contact pads on the chip card engage the contacts 25.

The card moves along an insertion path which includes an external card path portion 56 that extends along the ramp to the aperture 31, and the internal portion 52, as the leading edge of the card moves from the aperture 31 to the stop 42. During movement along the inner insertion path portion, opposite sides of the chip card are guided by lugs such as 36.

FIG. 4 shows that the top sheet metal portion 26 has two lugs 36, 37 formed at opposite sides of the internal path portion of the card. The side lugs engage opposite sides of the card and control its position and orientation until the card abuts the stop lug 42. As a result, the ramp 30, the opposite sides 32, 33 of the ramp, the side guiding lugs 36, 37, and the stop lug 42, are all formed in the top sheet metal cover portion 13. It is noted that each of the lugs 36, 37 and 42 are formed by partial punching out a small area of the sheet metal, which leaves small holes 38, 39. Each lug has an approximately right angle bend at its top, so the lug extends downwardly. As mentioned above, the ramp 30 and sides 32, 33 are formed by deep drawing of the sheet metal.

FIG. 3 shows that when the chip card 20 is fully inserted, a rear portion 23 of the card projects out of the aperture 31 and lies on the ramp 30. This allows a person to retract the chip card by pressing his finger against the portion 23, or pressing a pencil eraser against the chip card, to slide the chip card out of the PC card. It is also possible to insert a pencil point or other sharp instrument into a hole adjacent to the lug 42 to push outward against the leading edge of the card.

Figure 7:
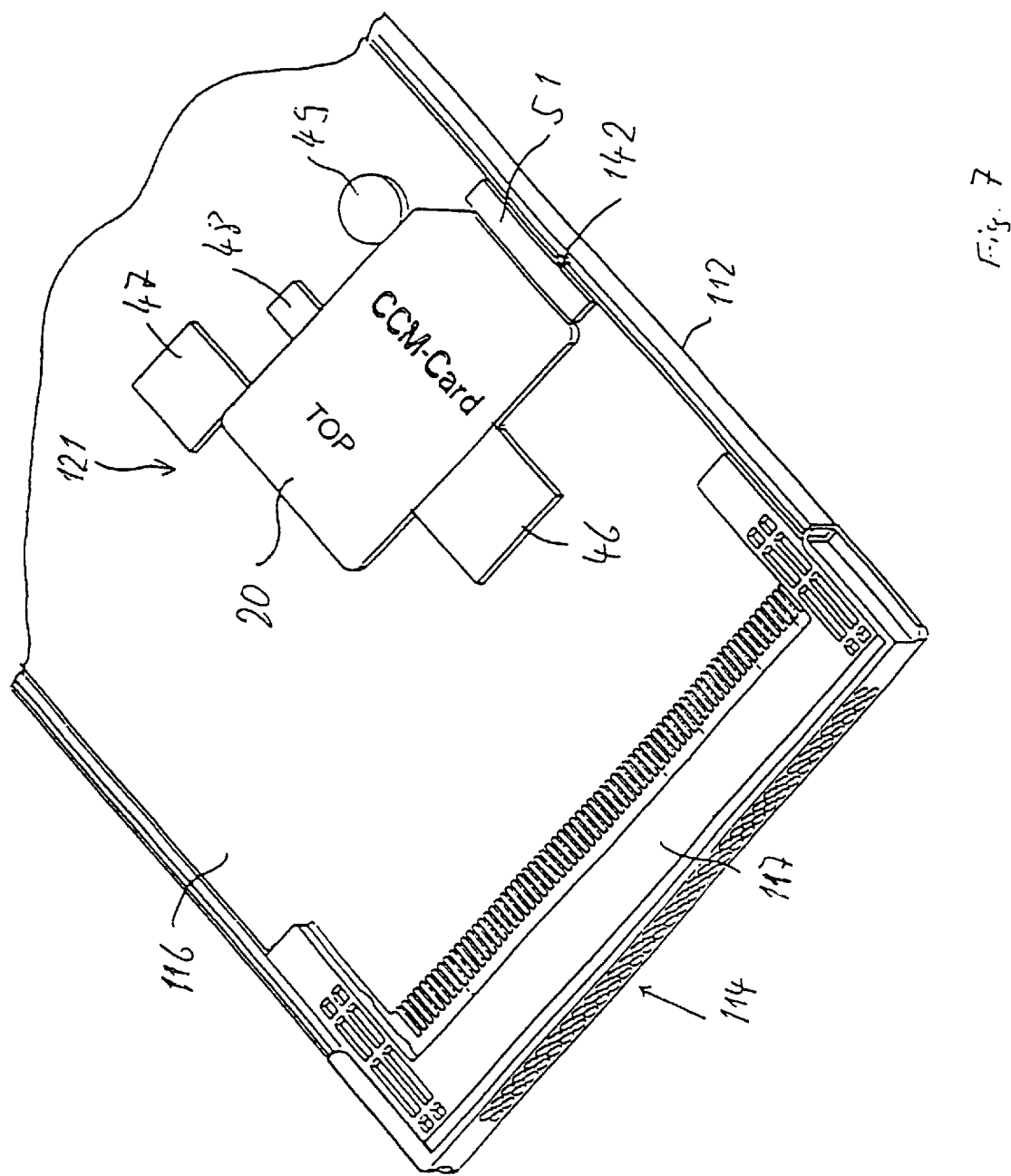
FIG. 7 is a view of the PC card of FIG. 6, with a chip card in its fully installed position therein.

FIGS. 5–7 illustrate another PC card 100. As shown in FIG. 5, the top cover portion 113 has a ramp 30 with opposite sides 32, 33 and an aperture 31, of the same construction as shown in FIG. 3. However, no lugs have been stamped out of the top cover portion in order to guide the chip card as it moves along an internal path portion lying below the flat sheet metal 26 of the top cover part. Instead, as shown FIG. 6, applicant uses components labeled 46–49 to guide opposite side edges of the chip card, until the leading edge of the chip card abuts a stop 142. The stop 142 is also formed by a component attached to the circuit board. The components 46–49 and 142 are preferably electronic circuit components through which current or electromagnetic energy passes, such as resistors, capacitors, and integrated circuits, including their housings. By allowing such circuit components to serve the double duty of processing signals and providing a guide for a card side, applicant minimizes the amount of space taken up by the card guide. Where necessary, it is possible to fix non-circuit components such as pieces of plastic to the circuit board to guide opposite side edges of the card and to form the stop at 142. It is not necessary or desirable to provide a frame that extends in a complete continuous rectangle around the card final position, but instead separate pieces can be mounted on the circuit board at opposite sides to minimize the space taken by the guides.

Figure 4B:
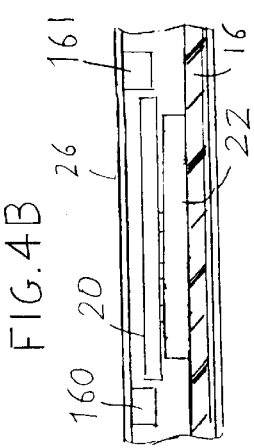
FIG. 4B is a sectional view taken on line 4B—4B of FIG. 4A but with different side guide parts.

FIG. 4B shows another construction wherein guides formed by small pieces 160, 161 of plastic are attached, as by adhesive or soldering to the top sheet metal cover portion 26. The use of small pieces 160, 161 leaves more area around the card for traces on the board and circuit components.

Although terms such as "top", "bottom" etc. have been used to describe the PC card as it is illustrated, it should be understood that it is possible to use the PC card and it components in any orientation with respect to the Earth.

Thus, the invention provides a PC card which can receive a chip card and connect to its contact pads in a simple and rugged construction. The top sheet metal cover portion has a flat cover region and a ramp part that is depressed therein, to extend at a downward incline of a plurality of degrees, and with an aperture having the width of the PC card and a thickness only slightly greater (e.g. preferably not more than three times as great) through which the chip card can be slid to a fully installed position. The ramp is preferably formed by deep drawing of the sheet metal to leave largely vertical side guides at opposite sides of the ramp. The card is guided along an internal card path portion at its opposite sides by side guides, and limited in sliding by a stop that engages the leading edge of the card. The side guides within the cover can be formed by downwardly-extending lugs partially stamped out of the top sheet metal portion. The internal side guides can be formed by components mounted on the circuit board, and preferably by circuit components. The internal guide also can formed by pieces fixed to the underside of the top sheet metal portion.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card of predetermined lateral width and vertical height which has a circuit board with conductive traces thereon, a front connector with front connector contact elements coupled to said traces, and top and bottom sheet metal cover portions lying respectively above and below said circuit board, for receiving a chip card of smaller width and height than that of said PC card, where the chip card has a face with contact pads, comprising:

a plurality of chip-engaging contacts terminated to said circuit board and having pad-engaging ends to engage the contact pads of a chip card;

said top sheet metal cover portion has an aperture that leads to said chip-engaging contacts so the chip card can be inserted at least partially through said aperture and along an internal path portion lying beyond said aperture to a position wherein said card contact pads engage said chip-engaging contacts;

said top sheet metal cover portion has a flat cover region and a ramp part that is depressed to extend at a downward incline of a plurality of degrees from a surrounding part of said flat cover region, with said aperture lying at a lower end of ramp part.

2. The PC Card described in claim 1 wherein:

said top sheet metal cover portion is deformed to form said ramp part, with said deformation leaving largely vertical ramp sides on opposite sides of said ramp.

3. The PC Card described in claim 1 wherein:

said top sheet metal cover portion forms a plurality of cutout tabs that lie on opposite sides of a horizontal imaginary extension of said ramp beyond said aperture, each tab extending downward from a right angle bend that connects to said top sheet metal cover portion, to guide the chip card to a position over said pad-engaging ends of said contacts.

4. The PC Card described in claim 1 including:
   at least two separate guide parts that are mounted on said circuit board on opposite sides of an imaginary horizontal extension of said ramp beyond said aperture to guide the chip card to a position over said pad-engaging ends of said contacts.

5. The PC Card described in claim 1 including:
   a plurality of card side guide parts fixed to a lower surface of said top sheet metal cover portion and having guide portions lying on opposite sides of an imaginary horizontal extension of said ramp beyond said aperture to guide the chip card to a position over said pad-engaging ends of said contacts.

6. A PC card that includes a circuit board with conductive traces thereon, largely planar top and bottom sheet metal cover portions lying respectively above and below said circuit board, wherein said PC card can receive a chip card that is smaller than said PC card, wherein the chip card has a face with contact pads, comprising:
   a chip card connector that includes an insulative body fixed to said circuit board and having a body upper face, and a plurality of contacts mounted on said insulative body and having tails soldered to said traces and pad-engaging ends extending above said body upper face;
   said top cover portion having a deep drawn region forming a ramp and an aperture at the bottom of said ramp, to guide a chip card through said ramp and along an inner path portion to a position over said contact pad-engaging ends;
   means forming side guides on opposite sides of said inner path portion to fix the position and orientation of the chip card, and a stop that stops insertion of said chip card.

7. A PC card of predetermined lateral width and vertical height which has a circuit board with conductive traces thereon, which has a front connector with front connector contact elements coupled to said traces, and which has a sheet metal cover with largely planar top and bottom sheet metal cover portions lying respectively above and below said circuit board, wherein said PC card is constructed to receive a chip card of smaller width and height than that of said PC card, where the chip card has a face with contact pads, comprising:
   a plurality of chip-engaging contacts terminated to said circuit board and having pad-engaging ends to engage the contact pads of a chip card;
   said top sheet metal cover portion has an aperture that leads along an internal path portion to said chip-engaging contacts so the chip card can be inserted at least partially through said aperture and along said internal path portion to a position wherein said card contact pads engage said chip-engaging contacts;
   a plurality of side guide parts lying between said top sheet metal cover portion and said circuit board and fixed to at least one of them, said side guide parts lying on opposite sides of said internal path portion to guide said chip card along said internal path portion as said chip card is inserted through said aperture;
   a plurality of electronic circuit component mounted on said circuit board with at least one component forming one of said side guide parts and lying on at least one side of said insertion path and projecting high enough to control the position of one side of said chip card as it moves along said path.

8. The PC Card described in claim 7 wherein:
   said at least one component and a second of said electronic circuit components lie on opposite sides of said internal insertion path.

9. A PC card of predetermined lateral width and vertical height which has a circuit board with conductive traces thereon, which has a front connector with front connector contact elements coupled to said traces, and which has a sheet metal cover with largely planar top and bottom sheet metal cover portions lying respectively above and below said circuit board, wherein said PC card is constructed to receive a chip card of smaller width and height than that of said PC card, where the chip card has a face with contact pads, comprising:
   a plurality of chip-engaging contacts terminated to said circuit board and having pad-engaging ends to engage the contact pads of a chip card;
   said top sheet metal cover portion has an aperture that leads along an internal path portion to said chip-engaging contacts so the chip card can be inserted at least partially through said aperture and along said internal path portion to a position wherein said card contact pads engage said chip-engaging contacts;
   a plurality of side guide parts lying between said top sheet metal cover portion and said circuit board and fixed to at least one of them, said side guide parts lying on opposite sides of said internal path portion to guide said chip card along said internal path portion as said chip card is inserted through said aperture;
   said top sheet metal cover portion has a flat cover region and has a ramp part that is depressed to extend at a downward incline of a plurality of degrees from said flat cover region, with said aperture lying at a lower end of ramp part.

10. The PC card described in claim 9 wherein:
    said top sheet metal cover portion is deformed to form said ramp part, with said deformation leaving largely vertical ramp sides on opposite sides of said ramp.

\* \* \* \* \*